(12) United States Patent
Huang et al.

(10) Patent No.: US 8,476,672 B2
(45) Date of Patent: Jul. 2, 2013

(54) ELECTROSTATIC DISCHARGE PROTECTION DEVICE AND METHOD FOR FABRICATING THE SAME

(75) Inventors: Ru Huang, Beijing (CN); Lijie Zhang, Beijing (CN)

(73) Assignee: Peking University, Beijing (CN)

( * ) Notice: Subject to any disclaimer, the term of this patent is extended or adjusted under 35 U.S.C. 154(b) by 148 days.

(21) Appl. No.: 13/201,370

(22) PCT Filed: Apr. 2, 2011

(86) PCT No.: PCT/CN2011/072409
§ 371 (c)(1),
(2), (4) Date: Aug. 22, 2011

(87) PCT Pub. No.: WO2011/137701
PCT Pub. Date: Nov. 10, 2011

(65) Prior Publication Data
US 2012/0018775 A1   Jan. 26, 2012

(30) Foreign Application Priority Data
May 5, 2010  (CN) .......................... 2010 1 0163416

(51) Int. Cl.
*H01L 29/86* (2006.01)
*H01L 21/329* (2006.01)

(52) U.S. Cl.
USPC .................. 257/109; 257/107; 257/E29.181; 257/E29.325; 257/E21.351; 438/139

(58) Field of Classification Search
USPC .... 257/107, 109, E29.325, E21.351; 438/139
See application file for complete search history.

(56) References Cited

U.S. PATENT DOCUMENTS
7,154,152 B2   12/2006  Kojima
2002/0053704 A1*   5/2002  Avery et al. .................... 257/361

FOREIGN PATENT DOCUMENTS
CN   101202280 A   6/2008
CN   100541781 C   9/2009
CN   101847633 A   9/2010

* cited by examiner

*Primary Examiner* — Victor A Mandala
*Assistant Examiner* — Whitney T Moore
(74) *Attorney, Agent, or Firm* — Maschoff Brennan

(57) ABSTRACT

The present invention provides an ESD protection device comprising a SCR structure that is a transverse PNPN structure formed by performing a P-type implantation and an N-type implantation in an N-well and a P-well on a silicon substrate, respectively, wherein a P-type doped region in the N-well is used as an anode, and N-type doped region in the P-well is used as a cathode, characterized in that, N-type dopants are implanted into the N-well to form one lead-out terminal of a resistor, P-type dopants are implanted into the P-well to form another lead-out terminal for the resistor, and the two leading-out terminals are connected by the resistor.

7 Claims, 2 Drawing Sheets

ELECTROSTATIC DISCHARGE PROTECTION DEVICE AND METHOD FOR FABRICATING THE SAME

FIELD OF THE INVENTION

The present invention relates to the technology of CMOS ultra-large-scale integrated circuits (ULSI), in particular relates to a structure of an ESD protection device and a method for fabricating the same.

BACKGROUND OF THE INVENTION

Electrostatic discharge (ESD) is harmful to electronic circuits. Generally, an integrated circuit is provided with an electrostatic protection device at an input/output port to discharge the current generated by static electricity, so as to prevent the circuit from being damaged by the static electricity. Since the structure of silicon-controlled rectifier (SCR) possesses 'snapback' characteristic, it is generally used as an ESD protection device. SCR has high current-discharging capability and excellent cut-off characteristics; however, the threshold voltage of SCR structure is high. Numerous researches have been made on how to reduce the threshold voltage of the SCR structure. At present, a trigger circuit is usually adopted to reduce the threshold voltage of the SCR structure, and the trigger circuit is generally implemented by means of series-connected diodes or MOSFETs, such as DTSCR, LVSCR, etc. Since the structures of such devices are complicated and the trigger voltages thereof are generally high, it is difficult to meet the requirement of a low supply voltage when the size of the CMOS device is further reduced. Moreover, the area occupied by the protection circuit is relatively large due to the trigger circuit introduced. In order to follow the trend that the size of the CMOS device continues being reduced, it is necessary that the ESD protection devices possess characteristics of a low trigger voltage, a simple structure and a small area, etc.

SUMMARY OF THE INVENTION

An object of the present invention is to provide an ESD protection device having a low trigger voltage, and a method for fabricating the same.

The above mentioned object of the present invention is achieved through following technical solutions.

An ESD protection device comprising a SCR structure, the ESD protection device comprises a transverse PNPN structure formed by performing a P-type implantation and an N-type implantation into an N-well and a P-well on a silicon substrate, respectively, wherein a P-type doped region in the N-well is used as an anode, and an N-type doped region in the P-well is used as a cathode, characterized in that, N-type dopants are implanted into said N-well to form one lead-out terminal of a resistor, P-type dopants are implanted into said P-well to form another lead-out terminal of the resistor, and the two lead-out terminals are connected through the resistor.

Said resistor is a polysilicon resistor or an active region resistor.

The N-well and the P-well on said silicon substrate are isolated by STI.

A method for fabricating an ESD protection device, comprises steps of:

1) performing a P-type implantation and an N-type implantation on a silicon substrate to form an N-well and a P-well, respectively;

2) etching polysilicon to form a resistor when forming a polysilicon gate structure;

3) performing a heavy N-type doping implantation on a region of a part of the N-well to form an $N^+$ region which is to be used as one lead-out terminal of the resistor, while performing a heavy N-type doping implantation on a region of a part of the P-well to form a cathode of the device;

4) performing a heavy P-type doping implantation on a region of a part of the P-well to form a $P^+$ region which is to be used as another lead-out terminal of the resistor, while performing a heavy P-type doping implantation on a region of a part of the N-well to form an anode of the device;

5) using a standard process for CMOS to finish subsequent fabrication of the ESD protection device.

Moreover, in the step 1), concentrations for the P-type implantation and the N-type implantation are $10^{17}$ to $10^{18}/cm^3$.

Moreover, in the step 3) and step 4), concentrations for the heavy P-type doping implantation and the heavy N-type doping implantation are $10^{18}$ to $10^{21}/cm^3$.

Moreover, in the step 1), the N-well and the P-well on the silicon substrate are isolated by STI.

The technical advantages and effects of the present invention are as follows:

With reference to FIG. 2, according to the present invention, a lead-out terminal of an N-well and a lead-out terminal for a P-well in the SCR structure are connected by the resistor, so that the SCR structure having a low trigger voltage is obtained. The SCR structure is small in area, and the integration degree thereof is high. As for the silicon-based process, the trigger voltage thereof is low, which is about 1.4 V.

The present invention is completely compatible with the conventional CMOS process and is simple in fabrication, meanwhile, the fabrication method is effective in any standard process, thereby, the cost is reduced to a maximum extent.

BRIEF DESCRIPTION OF THE DRAWINGS

Hereinafter, the present invention will be further described in detail with reference to the accompanying drawings.

DETAILED DESCRIPTION OF THE EMBODIMENTS

Preferred embodiments of the present invention will be described below in more detail with reference to the accompanying drawings of the present invention.

On a silicon substrate, an N-well and a P-well are formed through N-type doping and P-type doping, and meanwhile a shallow trench isolation (STI) is formed. In order to prevent mutual diffusions between the P-type doped region and the N-type implanted lead-out region in the N well, the two regions are isolated by the STI, and in the same way the mutual diffusions between the N-type doped region and the P-type implanted lead-out region in the P-well may be prevented. A P-type implantation and an N-type implantation are performed in the N-well and the P-well on the silicon substrate, respectively, to form a transverse PNPN structure. The present invention proposes that, in the N-well, an N-type implantation region is arranged away from the P-type implantation region so as to be used as a lead-out terminal of the N-well, while in the P-well, a P-type implantation region is arranged away from the N-type implantation region so as to be used as a lead-out terminal of the P-well. The lead-out terminal of the N-well and the lead-out terminal of the P-well are connected through a resistor, so that an SCR structure having a low trigger voltage is obtained. The resistor may be either a polysilicon resistor, or an active region resistor.

The lead-out terminal of the N-well is located in the N-well but cannot be located next to the P-type implantation region, and it is necessary to ensure that doped impurities are not mutually diffused between the P-type implantation region and the N-type implantation region of the lead-out terminal of the N-well. On the other hand, the lead-out terminal of the P-well is located in the P-well but cannot be located next to the N-type implantation region, and it is necessary to ensure that doped impurities are not mutually diffused between the N-type implantation region and the P-type implantation region of lead-out terminal of the P-well. Moreover, both of the lead-out terminals may be adjusted properly according to the value of the polysilicon resistor as actually needed.

The present invention will be further described below in combination with embodiments. However, the application of the present invention is not limited to the following specific embodiments.

Embodiment 1

Figure 1:
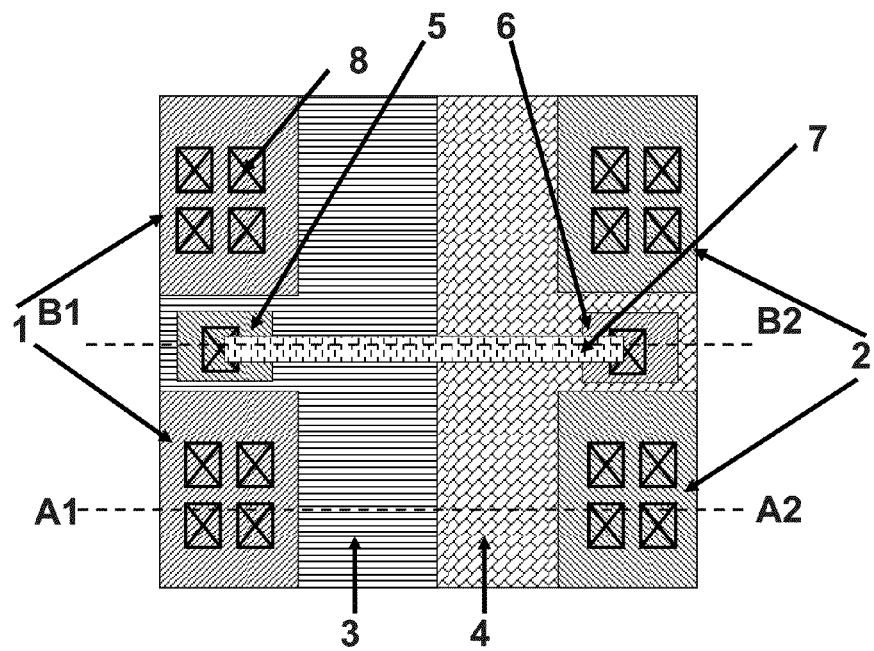
FIG. 1 is a top view illustrating a layout of an ESD protection device according to the present invention.
Figure 2:
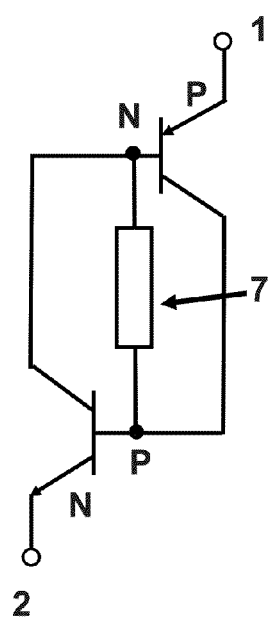
FIG. 2 is an equivalent circuit diagram of the ESD protection device according to the present invention.
Figure 3:
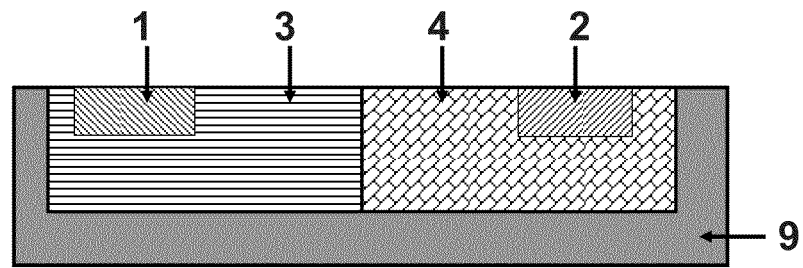
FIG. 3 is a view of cross-section A in FIG. 1.
Figure 4:
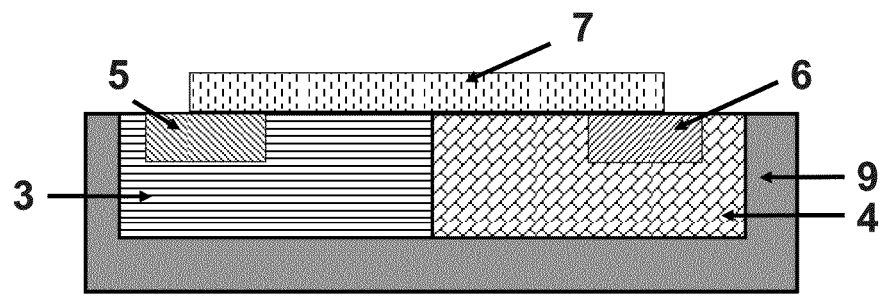
FIG. 4 is a view of cross-section B in FIG. 1. Wherein '1' denotes cathodes of the device; '2' denotes anodes of the device; '3' denotes N-well; '4' denotes P-well; '5' denotes lead-out terminal of the resistor in the N-well; '6' denotes lead-out terminal of the resistor in the P-well; '7' denotes the resistor; and '8' denotes lead-out holes.

FIG. 1 is a schematic diagram illustrating a layout of an ESD protection device according to the present invention, in which not all the layers in the actual design are included, such as layouts of active region, layouts of each layer of metal lines, etc. The cross-section views of the ESD protection device (RTSCR) structure are shown in FIG. 3 and FIG. 4.

The present invention can be achieved by means of layout design and by using standard CMOS process. In the above-mentioned layout design, the shape of the polysilicon is not limited to the shape as shown in FIG. 1, but may be formed in various shapes. In order to increase the value of the polysilicon resistor, the polysilicon may be formed in the shape of slim zigzag stripes. The polysilicon resistor region should be covered by a silicidation protection mask, so that it is not influenced by subsequent silicidation processes for source and drain regions. The positions of the lead-out terminals of the N-well and the P-well are not limited to those as shown in FIG. 1, but may be located at any position in the N-well and the P-well as needed. In order to increase the value of the polysilicon resistor, it is preferable that the lead-out terminal of the N-well and the lead-out terminal of the P-well are arranged close to the outer edges of the N-well and the P-well, that is, the two lead-out terminals should be as far away from each other as possible.

A process for fabricating the above-mentioned device is as follows:

At the beginning of the fabrication, the same substrate material as used in the conventional MOS is adopted;

Firstly, when performing a well implantation process according to the standard process, a light N-type doping implantation and a light P-type doping implantation are performed, respectively, by using the layout for the N-well and the P-well as shown in FIG. 1, and the implantation concentration is $10^{17}$ to $10^{18}/cm^3$.

Next, a polysilicon resistor is formed when forming a polysilicon gate structure during a CMOS process. A polysilicon layer is first deposited, and photolithography and etching are performed by using the polysilicon resistor layout as shown in FIG. 1 to form a plurality of polysilicon resistor stripes.

Subsequently, according to the layout of $N^+$ implantation as shown in FIG. 1, an N-type doping implantation is performed in the N-well and the implantation concentration is $10^{19}$ to $10^{21}/cm^3$, so that one lead-out terminal of the polysilicon resistor is formed, while an N-type doping implantation is performed in the P-well to form a cathode of the device, and such a step may be implemented when performing a doping implantation with respect to the source and drain regions of the NMOS during the standard process. Then, according to the layout of $P^+$ implantation as shown in FIG. 1, a P-type doping implantation is performed in the N-well to form an anode of the device, while a P-type doping implantation is performed in the P-well to form another lead-out terminal of the polysilicon resistor, and such a process may be implemented when performing a doping implantation to the source and drain regions of the PMOS during the standard process. Next, a silicidation process for the anode/cathode lead-out terminals is performed. In the subsequent process, the RTSCR structure of the ESD protection device is formed completely identical to that of the conventional MOS structure, and following steps are performed sequentially: depositing an isolation layer; performing photolithography to form via holes; depositing metal and performing photolithography to form metal wirings; and performing passivation.

The length and width of the polysilicon resistor may be implemented through the layout, while the thickness of the polysilicon resistor is determined by the implemented process.

Embodiment 2

The lead-out terminals of the N-well and the P-well according to the present invention may also be connected to the two ends of the active region resistor. The size of the layout used as the active region resistor may be determined according to practical requirements. The lead-out terminals of the N-well and the P-well may be located at any position in the N-well and the P-well as needed.

The process for fabricating the device is as follows:

At the beginning of the fabrication, the same substrate material as conventional MOS is adopted (taking P-type material as an example).

Firstly, an implantation for the active region is performed. Then, when a well implantation process according to the standard process is used, a light N-type doping implantation and a light P-type doping implantation are performed, respectively, by using the layout of the N-well and the P-well as shown in FIG. 1, wherein the implantation concentration is $10^{17}$ to $10^{18}/cm^3$.

Next, according to the layout of $N^+$ implantation as shown in FIG. 1, an N-type doping implantation is performed in the N-well to form one lead-out terminal of the active region resistor, while an N-type doping implantation is performed in the P-well to form a cathode of the device. This step may be implemented when performing a doping implantation to the source and drain region of the NMOS during the standard process.

According to the layout of $P^+$ implantation as shown in FIG. 1, a P-type doping implantation is performed in the N-well to form an anode for the device, while a P-type doping implantation is performed in the P-well to form another lead-out terminal of the active region resistor. Meanwhile, the P-type doping implantation is performed on two parts separated from each other in the active region to form the two lead-out terminals of the active region resistor, and this step may be implemented when performing a doping implantation to the source and drain regions of the PMOS during the standard process.

In subsequent process, the following steps are performed sequentially: performing silicidation for all of the lead-out terminals; depositing an isolation layer; performing photolithography to form via holes; depositing metal and performing photolithography to form metal wirings; and performing passivation. The two ends of the active region resistor are connected via polysilicon connections or metal connections to the two lead-out terminals in P-well and N-well, respectively.

Wherein, the length and width of the active region resistor may be implemented through the layout.

Although, in the present disclosure, the structure of RTSCR device according to the present invention and the process for fabrication by using CMOS process are described in detail through specific embodiments, it should be understood by those skilled in the art that the mode for implementing the present invention is not limited to the scope described in the embodiments, such as the design and fabrication of the ESD protection device of a circuit on the basis of SOI process, etc. Various changes and modifications may be made to the present invention without departing from the scope of the substance and spirit of the present invention.

What is claimed is:

1. An ESD protection device comprising an SCR structure which is a transverse PNPN structure formed by performing a P-type implantation and an N-type implantation into an N-well and a P-well on a silicon substrate, respectively, wherein a P-type doped region in the N-well is used as an anode, and an N-type doped region in the P-well is used as a cathode, characterized in that, N-type dopants are implanted into the N-well to form one lead-out terminal of a resistor, P-type dopants are implanted into the P-well to form another lead-out terminal of the resistor, and the two lead-out terminals are connected through the resistor.

2. The device according to claim 1, characterized in that, the resistor is a polysilicon resistor or an active region resistor.

3. The device according to claim 1, characterized in that, the N-well and the P-well on the silicon substrate are isolated by STI.

4. A method for fabricating an ESD protection device, comprising steps of:
   1) performing a P-type implantation and an N-type implantation on a silicon substrate to form an N-well and a P-well, respectively;
   2) etching the polysilicon to form a resistor when forming a polysilicon gate structure;
   3) performing a heavy N-type doping implantation on a region of a part of the N-well to form an N+ region to be used as one lead-out terminal of the resistor, while performing a heavy N-type doping implantation on a region of a part of the P-well to form a cathode of the device;
   4) performing a heavy P-type doping implantation on a region of a part of the P-well to form a P+ region to be used as another lead-out terminal for the resistor, while performing a heavy P-type doping implantation on a region of a part of the N-well to form an anode of the device;
   5) using a standard process for CMOS to finish subsequent fabrication of the ESD protection device.

5. The method according to claim 4, characterized in that, in the step 1), concentrations for the P-type implantation and the N-type implantation are $10^{17}$ to $10^{18}/cm^3$.

6. The method according to claim 4, characterized in that, in the step 3) and step 4), concentrations for the heavy P-type doping implantation and the heavy N-type doping implantation are $10^{19}$ to $10^{21}/cm^3$.

7. The method according to claim 4, characterized in that, in the step 1), the N-well and the P-well on the silicon substrate are isolated by STI.

* * * * *